US007400283B1

(12) United States Patent
Zhu

(10) Patent No.: US 7,400,283 B1
(45) Date of Patent: Jul. 15, 2008

(54) MIXED SIGNAL SYSTEM-ON-A-CHIP INTEGRATED SIMULTANEOUS MULTIPLE SAMPLE/HOLD CIRCUITS AND EMBEDDED ANALOG COMPARATORS

(75) Inventor: Limin Zhu, Fremont, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 11/612,771

(22) Filed: Dec. 19, 2006

(51) Int. Cl.
*H03M 1/00* (2006.01)

(52) U.S. Cl. ....................................... 341/141; 341/122

(58) Field of Classification Search ................. 341/141, 341/142, 122–124, 155
See application file for complete search history.

(56) References Cited

U.S. PATENT DOCUMENTS

| | | | | |
|---|---|---|---|---|
| 5,422,643 | A * | 6/1995 | Chu et al. | 341/141 |
| 6,657,574 | B1 * | 12/2003 | Rhode | 341/155 |
| 6,697,006 | B1 * | 2/2004 | McCartney et al. | 341/155 |
| 6,801,146 | B2 * | 10/2004 | Kernahan et al. | 341/122 |
| 6,927,712 | B2 * | 8/2005 | Wei | 341/122 |
| 6,952,461 | B2 * | 10/2005 | Yasuda et al. | 375/372 |
| 7,002,498 | B2 * | 2/2006 | Chia | 341/141 |
| 7,030,796 | B2 * | 4/2006 | Shim et al. | 341/141 |
| 2003/0071748 | A1 * | 4/2003 | Huang et al. | 341/155 |
| 2005/0134490 | A1 * | 6/2005 | Cox | 341/141 |
| 2005/0190090 | A1 * | 9/2005 | Chia | 341/141 |
| 2006/0164279 | A1 * | 7/2006 | Brewer et al. | 341/172 |

OTHER PUBLICATIONS

"ADS7869 Analog Motor Control Front-End with Simultaneous Sampling on Seven S/H Capacitors and Three 1MSPA, 12-Bit, 12-Channel ADCs", Data Manual, Literture Number: SBAS253E, Texas Instruments Inc., May 2003 - Revised Jul. 2006, pp. 1-69, Dallas, TX, USA.

"MicroConverter® Quick Reference Guide", Data Sheet ADuC824, Analog Devices, Inc., [Internet] http://www.analog.com/microconverter, circa 2002, 2 pages, Norwood, MA, USA.

"MicroConverter®, Dual-Channel 16-/24-Bit ADCs with Embeded Flash MCU", Data Sheet ADuC824, Rev. B, Analog Devices, Inc., [Internet] http://www.analog.com, May 2002, pp. 1-68, Norwood, MA, USA.

"Fundamentals of Sampled Data Systems", Application Note AN-282, Analog Devices, Inc., date unknown, 21 pages, Norwood, MA, USA.

"A Glossary of Analog-to-Digital Specification and Performance Characteristics", Application Report, SBAA147, Texas Instruments Inc., Aug. 2006, pp. 1-30, Dallas, Texas, USA.

"Principles of Data Acquisition and Cnaversion", Application Bulletin, Burr-Brown Corporation, May 1994, pp. 1-5, Tucson, AZ, USA.

* cited by examiner

*Primary Examiner*—Linh Nguyen
(74) *Attorney, Agent, or Firm*—Lewis and Roca LLP

(57) ABSTRACT

An integrated circuit includes a plurality of circuit groups, each circuit group containing a plurality of analog inputs, a buffer, a sample/hold circuit and a comparator. Each buffer has an input to which any of the analog inputs in its group may be programmably connected. The output of each buffer is coupled to the input of the sample/hold circuit in the group. The output of each sample/hold circuit is coupled to one input of a multiplexer. The output of the multiplexer is coupled to the input of an amplifier having programmable gain and programmable offset. The comparator in each group has inputs that may be programmably coupled to at least one analog input in the group or to a reference voltage source.

5 Claims, 3 Drawing Sheets

MIXED SIGNAL SYSTEM-ON-A-CHIP INTEGRATED SIMULTANEOUS MULTIPLE SAMPLE/HOLD CIRCUITS AND EMBEDDED ANALOG COMPARATORS

BACKGROUND OF THE INVENTION

1. Field of the Invention

The present invention relates to integrated circuits. More particularly, the present invention relates to system-on-a-chip integrated circuits.

2. The Prior Art

Usually system designers employ multiple analog-to-digital converter (ADC) parts to achieve simultaneous analog signal sampling capability. Some analog ADC integrated circuits, such as the ADuC824 manufactured and sold by Analog Devices, employ a multiplexer before an input buffer as shown in FIG. 1, making it impossible to achieve simultaneous sampling if only one ADC chip is used.

Some ADC integrated circuits, such as the ADS7869 manufactured and sold by Texas Instruments, provide three analog-to-digital converters on one chip, as shown in FIG. 2. The ADS7869 includes three, SAR-type, 12-bit ADCs, and three pairs of sample/hold capacitors, which are connected to ADC1 and ADC2, respectively. A single sample/hold capacitor is connected to ADC3. Each sample/hold input is selected from one of four analog inputs. Up to three on-chip ADCs are needed in order to implement simultaneous sampling for up to three analog inputs.

Analog comparators are usually discrete devices used in mixed-signal systems. Some ADC integrated circuits, such as the ADS7869 manufactured and sold by Texas Instruments, have an on-chip window comparator and sign comparator. The window comparator is used to test if the input voltage is within a certain range and the sign comparator is used, for example, for the position sensor inputs in motor control applications or to measure the sign of the main circuits.

BRIEF DESCRIPTION OF THE INVENTION

An integrated circuit includes a plurality of circuit groups, each circuit group containing a plurality of analog inputs, a buffer, a sample/hold circuit and a comparator. Each buffer has an input to which any of the analog inputs in its group may be programmably connected. The output of each buffer is coupled to the input of the sample/hold circuit in the group. The output of each sample/hold circuit is coupled to one input of a multiplexer. The output of the multiplexer is coupled to the input of an amplifier having programmable gain and programmable offset. The comparator in each group has inputs that may be programmably coupled to at least one analog input in the group or to a reference voltage source.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
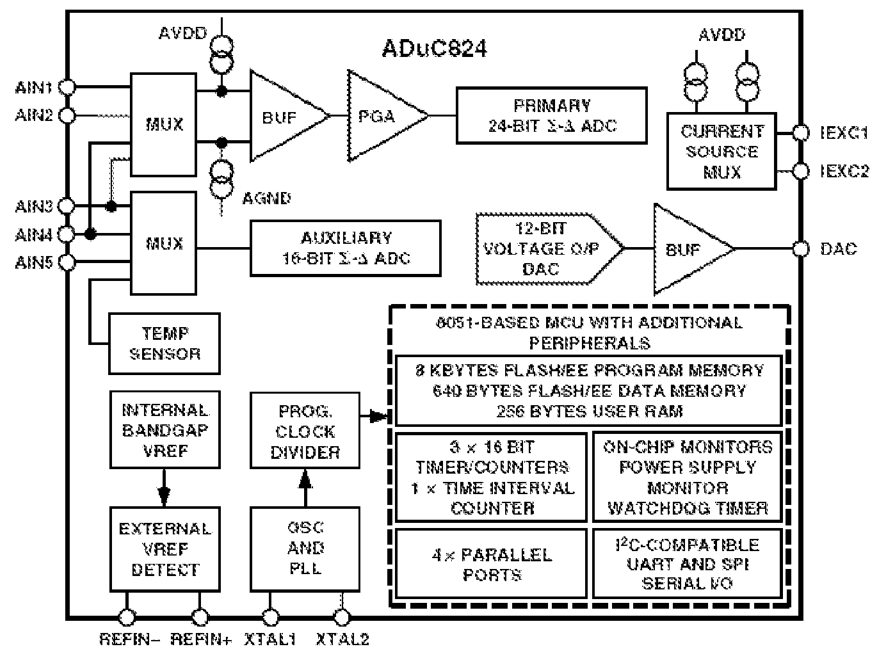
FIG. 1 is a functional block diagram of a typical prior-art analog-to-digital converter circuit.
Figure 2:
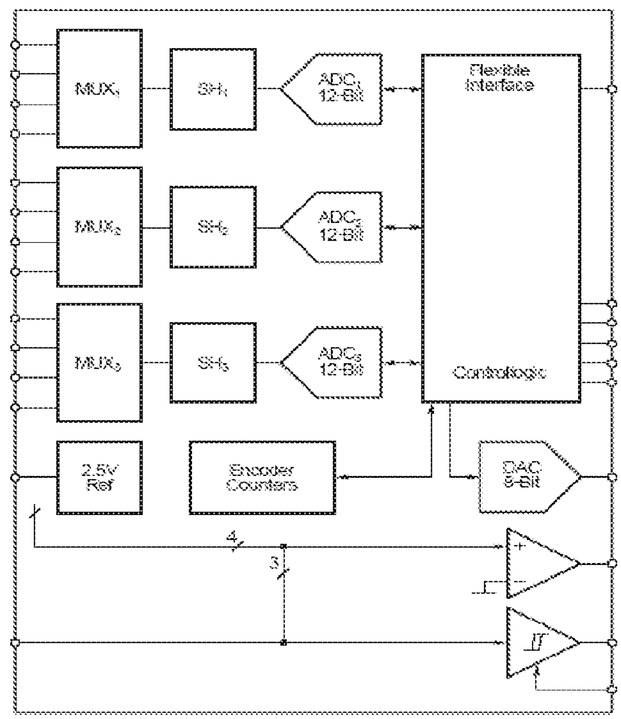
FIG. 2 is a functional block diagram of another typical prior-art analog-to-digital converter circuit.
Figure 3:
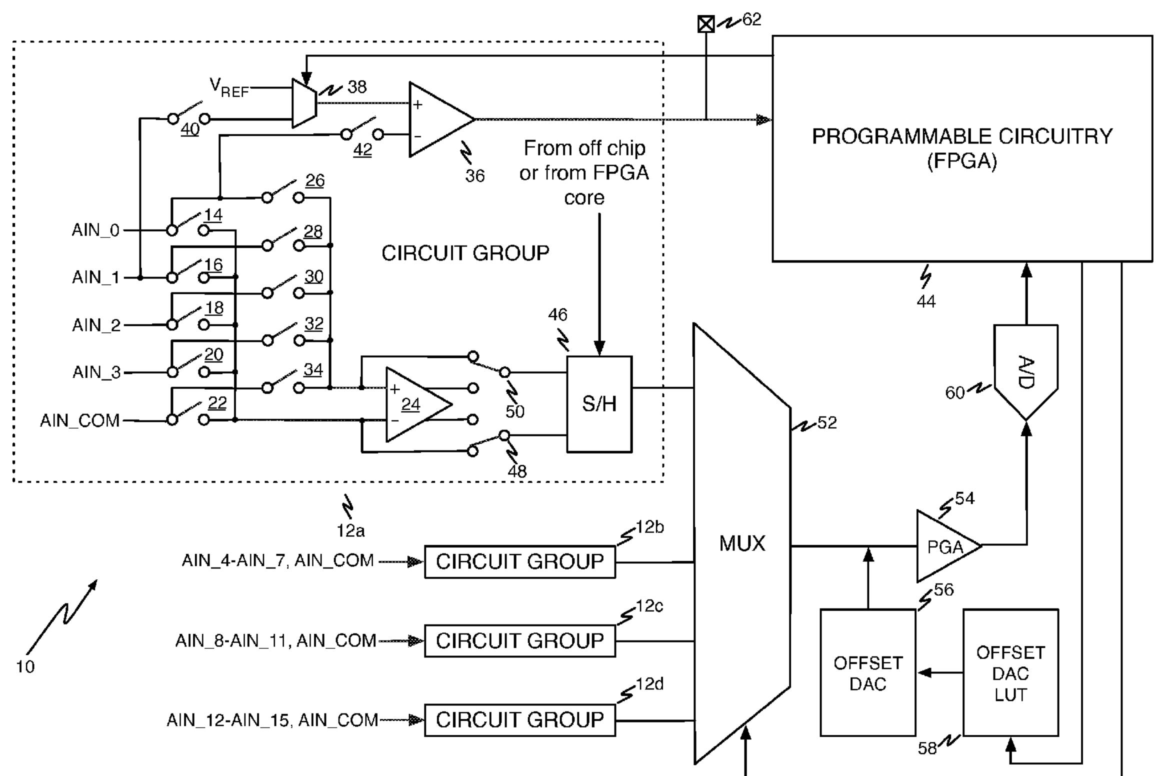
FIG. 3 is a schematic diagram showing an illustrative embodiment of the present invention.

Referring first to FIG. 3, a schematic diagram shows an illustrative embodiment of a mixed-signal system-on-a-chip including simultaneous multiple sample/hold circuits and embedded analog comparators 10 according to the present invention. According to the present invention, a plurality of circuit groups is provided. While the number of circuit groups shown in the illustrative embodiment of FIG. 3 is four, persons of ordinary skill in the art will appreciate that other numbers of circuit groups could be used.

FIG. 3 shows one of the circuit groups in detail. Persons of ordinary skill in the Art will understand that the other circuit groups may be similar or identical to the single circuit group shown as 12*a* in the figure. The first circuit group (shown within dashed lines 12*a*) includes analog inputs AIN_0 through AIN_3 as well as an analog common input AIN_COM. These analog inputs are fed to a first bank of programmable analog switches in which switch 14 is coupled to analog input AIN_0, switch 16 is coupled to analog input AIN_1, switch 18 is coupled to analog input AIN_2, switch 20 is coupled to analog input AIN_3, and switch 22 is coupled to analog input AIN_COM. The switches 14, 16, 18, 20, and 22 may be selectively closed to couple any one of the analog inputs to the inverting input of buffer amplifier 24. The analog switches may be formed from pass gates as is known in the art.

The analog inputs are also fed to a second bank of programmable analog switches in which switch 26 is coupled to analog input AIN_0, switch 28 is coupled to analog input AIN_1, switch 30 is coupled to analog input AIN_2, switch 32 is coupled to analog input AIN_3, and switch 34 is coupled to analog input AIN_COM. The switches 26, 28, 30, 32, and 34 may be selectively closed to couple any one of the analog inputs to the non-inverting input of buffer amplifier 24.

The programmable analog input switching network is designed for any combination of differential inputs to be selected as the input channel, or for the configuration of any single-ended analog inputs. In the case of differential mode, it may be seen that any one analog input can be selected as the positive differential input channel and any other channel can be selected as the negative differential input channel. With this arrangement, and assuming four circuit groups are employed, it is possible to have up to sixteen single-ended analog inputs or up to sixteen fully differential input pairs. It is also possible to switch the polarity of the differential input pair to negate any offset voltages.

The input buffers may be bypassed to achieve different input impedance options and analog input operation voltage ranges. Based on this arrangement, user can make simultaneous sampling for a plurality of analog inputs by using just one ADC module. Those simultaneous sampling analog inputs may be selected through on-chip programmable logic circuitry such as, for example, a flash-based FPGA circuit block such as the ProASIC3 FPGA architecture contained in products available from Actel Corporation of Mountain View, Calif. The simultaneous sampling results can be converted into digital format by the ADC module and stored in memory such as on or off chip SRAM or flash memory that may be included in the programmable logic circuit block 44 or other known on or off chip digital data storage. The simultaneous comparison procedure may thus be processed in the digital domain (e.g., in on-chip FPGA logic or an on-chip processor implemented in the FPGA).

Analog comparator 36 compares the analog voltage at analog input AIN_0 with either the analog voltage at analog input AIN_1 or with a reference voltage $V_{REF}$ as selected by multiplexer 38. The select input of multiplexer 38 is driven by a signal from programmable logic circuitry, such as an FPGA core. Programmable analog switches 40 and 42, respectively, connect analog input AIN_1 to one input of the multiplexer 38 and input AIN_0 to the inverting input of the analog comparator 36. The output of analog comparator 36 is a digital signal that is fed into programmable logic circuitry, such as an FPGA core 44. FPGA core 44 also controls the on/off states of all of the analog switches shown in FIG. 3.

A sample/hold circuit 46 may be coupled to either the inputs or outputs of amplifier 24. The inputs of operational sample/hold circuit 46 may be sourced, respectively, from the outputs of the first and second switch banks, or the differential outputs of buffer 24 through double-throw programmable analog switches 48 and 50, respectively. As shown in FIG. 3, the sample control input of sample/hold circuit 46 may be driven from off chip or from the on-chip programmable logic circuitry.

As previously noted, the other groups of circuits may be configured the same way or similarly to the groups shown at reference numeral 12. The advantage of an integrated circuit including a plurality of circuit groups such as depicted in FIG. 3 is that simultaneous sampling for multiple analog signals is enabled.

The output of the sample/hold circuit 46 is presented to one input of multiplexer 52. As shown in FIG. 3, the outputs of other groups of circuits 12*b*, 12*c*, and 12*d* are shown coupled to the other data inputs of multiplexer 52. The select inputs of multiplexer 52 is driven by signals from the on-chip programmable logic circuitry 44. The output of multiplexer 52 is coupled to the input of programmable gain amplifier 54. An offset DAC 56 is coupled to programmable gain amplifier 54 to allow selecting a voltage offset for the amplifier. The offset DAC 56 is driven by an offset DAC lookup table 58. The input to the offset DAC lookup table 58 is provided from inside the on-chip programmable logic circuitry.

The output of programmable gain amplifier 54 is provided to A/D converter 60 to be digitized. The digital output of A/D converter 60 is fed into the programmable logic circuitry, such as FPGA core 44.

Use of a system according to the present invention contained on a single chip allows self configuration of the chip through programming of the on-chip programmable logic circuitry to provide simultaneous sampling of analog inputs. The system provides an on-chip process for analog input signal simultaneous sampling and comparison of results. As will be appreciated by persons of ordinary skill in the art, the integrated analog comparators used in the present invention are fully functional comparators, similar to regular discrete analog comparators. The first two analog input channels of each circuit group are connected to the respective analog comparators 36 for each circuit. One input of the analog comparator 36 can also be programmably connected to either one of the analog input channels or a reference voltage as shown in FIG. 3. The reference voltage is used as a comparison threshold voltage. Analog comparator 36 can be used for general purposes or for special applications such as zero-crossing detection. The comparison result of analog comparator 36 is fed directly to the programmable logic circuitry 44. For added flexibility, the comparison result of analog comparator 36 may also be provided to I/O pad 62.

Figure 4:
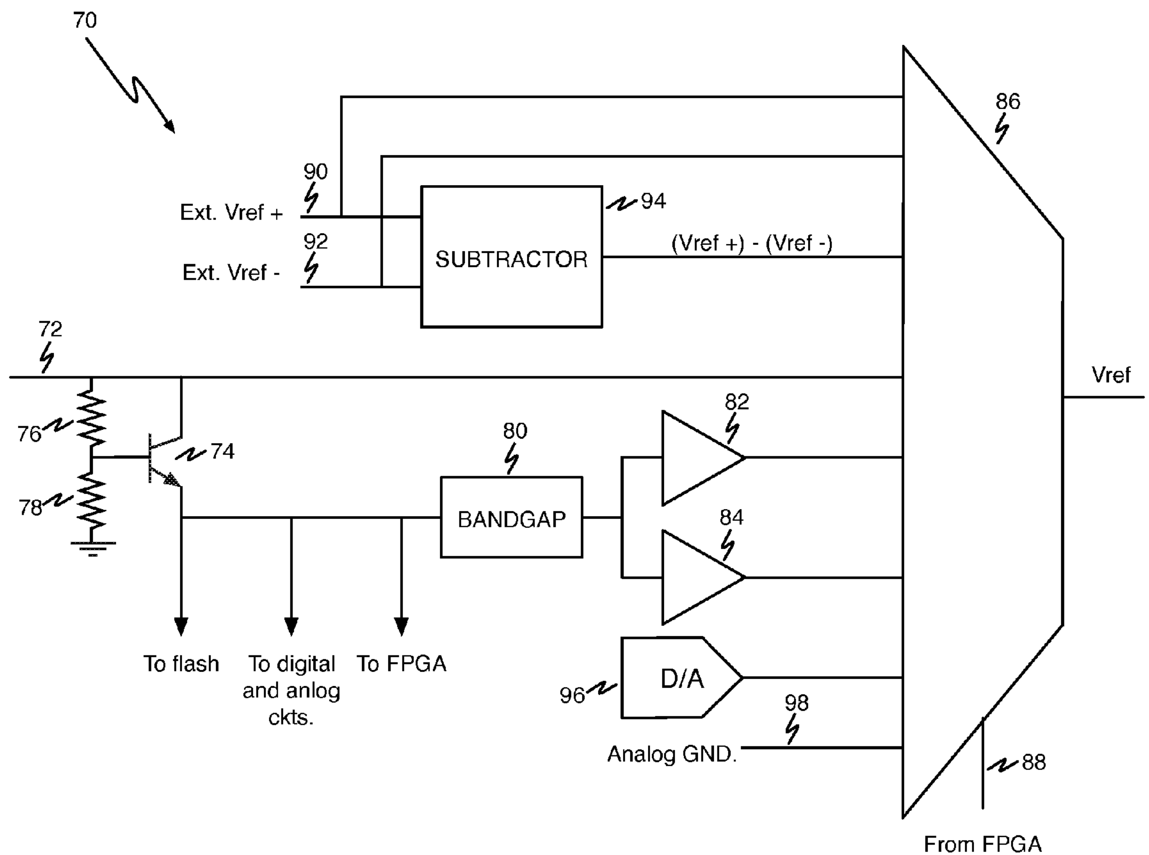
FIG. 4 is a schematic diagram showing an illustrative on-chip voltage reference circuit that may be used with the present invention.

The analog comparator inputs and comparison reference voltages can be flexibly controlled and selected by on-chip FPGA logic. Referring now to FIG. 4, a schematic diagram shows an illustrative on-chip voltage-reference circuit 70 that may be used with the present invention. The on-chip voltage-reference circuit 70 provides flexible analog comparator reference voltages to expand the comparison range of the system of the present invention.

On-chip voltage-reference circuit 70 uses power (e.g., 3.3V) supplied on input line 72. Transistor 74, configured as an emitter-follower, uses a voltage divider formed from resistors 76 and 78 to produce an output voltage (e.g., 1.5V) at its emitter. This voltage may be used to power portions of the integrated circuit such as flash memory, the programmable logic array, and various other analog and digital circuits as shown in FIG. 4.

The emitter of transistor 74 is also coupled to bandgap reference circuit 80. Bandgap reference circuits are known in the art. The output of bandgap reference circuit 80 is coupled to buffers 82 and 84. One of buffers 82 and 84 generates a positive reference voltage and the other one of buffers 82 and 84 generates a negative reference voltage.

Analog multiplexer 86, whose select inputs 88 are driven from the programmable logic core, selects between the voltage on input line 72, the output of either of buffers 82 and 84, one of several external reference voltages illustrated at lines 90 and 92, the difference between the references generated by subtractor circuit 94, the output of a D/A converter 96 whose input may be driven from the FPGA core, and analog ground shown at line 98.

Since the on-chip voltage-reference circuit 70 provides selectable threshold comparison voltage references for the on-chip analog comparators 36 of FIG. 3, it can expand the comparison range and offer more reference voltage threshold levels for operation.

The integrated system of the present invention offers multiple advantages over the prior art. First, it reduces discrete analog comparators required for most mixed-signal system designs. Second, the inputs of the analog comparator can be selected from among either analog input signals or voltage reference signals. This flexibility allows the analog comparators to perform comparisons between analog input signals or between analog input signals and selectable threshold voltages, which provides quick comparison results. This feature is useful for certain emergency comparison requirements. As an illustrative example, the running current of a motor needs to be monitored and measured during regular operation. If the current is out of the normal operating range (comparing to a threshold level), the system can identify the emergency status as soon as possible and turn off motor to avoid any risk of damage. In one embodiment, the analog comparison result is sent to the embedded flash FPGA core, which can run at high speed (>100 MHz), to allow the system to quickly make decisions and send out necessary control signals.

The present invention also provides a unique analog input stage arrangement to implement simultaneous sampling for multiple analog inputs by using on-chip sample and hold circuits and a single A/D converter module. Simultaneous sampling analog inputs are selected through on-chip programmable logic. Simultaneous sampling and conversion results can be stored in embedded flash memory and processed in the integrated flash programmable logic core.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit including:

a plurality of circuit groups, each circuit group containing a plurality of analog inputs, a plurality of programmable analog switches, a buffer, and a sample/hold circuit, the buffer having at least one input to which any of the analog inputs in its group may be programmably connected by selectively programming the programmable analog switches, each buffer having an output coupled to an input of the sample/hold circuit in the group;

a multiplexer having a plurality of inputs, each input coupled to an output of a different one of the sample/hold circuits;

an amplifier having an input coupled to an output of the multiplexer.

2. The integrated circuit of claim 1 wherein the amplifier has programmable gain.

3. The integrated circuit of claim 1 wherein the amplifier has programmable offset.

4. The integrated circuit of claim 1 wherein each circuit group further includes a comparator having inputs that may be programmably coupled to at least one analog input in the group.

5. The integrated circuit of claim 4, wherein at least one of the inputs of each comparator may be programmable coupled to coupled to a reference voltage source.

* * * * *